(12) United States Patent
Lee et al.

(10) Patent No.: US 8,504,896 B2
(45) Date of Patent: Aug. 6, 2013

(54) METHOD OF OPERATING NONVOLATILE MEMORY DEVICE AND NONVOLATILE MEMORY DEVICE FOR IMPLEMENTING THE SAME

(75) Inventors: Sang Kyu Lee, Chungcheongbuk-do (KR); Seung Jae Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 569 days.

(21) Appl. No.: 12/774,658

(22) Filed: May 5, 2010

(65) Prior Publication Data

US 2010/0332946 A1    Dec. 30, 2010

(30) Foreign Application Priority Data

Jun. 30, 2009 (KR) .......................... 10-2009-0059147

(51) Int. Cl.
*G11C 29/00* (2006.01)
(52) U.S. Cl.
USPC ............. 714/763; 714/6.1; 714/6.2; 714/6.24
(58) Field of Classification Search
USPC .................................. 714/763, 6.1, 6.2, 6.24
See application file for complete search history.

(56) References Cited

U.S. PATENT DOCUMENTS

| 5,471,478 A * | 11/1995 | Mangan et al. ............... 714/711 |
| 7,096,406 B2 * | 8/2006 | Kanazawa et al. ........... 714/763 |
| 7,757,153 B2 * | 7/2010 | Hwang et al. ................ 714/763 |
| 2003/0041299 A1 * | 2/2003 | Kanazawa et al. ........... 714/766 |
| 2008/0016428 A1 * | 1/2008 | Lee et al. ...................... 714/763 |

FOREIGN PATENT DOCUMENTS

| KR | 100865830 | 10/2008 |
| KR | 1020080114208 | 12/2008 |
| KR | 100895065 | 5/2009 |

OTHER PUBLICATIONS

Notice of Allowance issued from Korean Intellectual Property Office on May 12, 2011.

* cited by examiner

*Primary Examiner* — Charles Ehne
(74) *Attorney, Agent, or Firm* — IP & T Group LLP

(57) ABSTRACT

A method of operating a nonvolatile memory device including a memory cell array having first and second main cells for storing external input data, first spare cells for storing data for error correction code (ECC) processing on the data stored in the first and second main cells and second spare cells for storing data for ECC processing on the data stored in the first and second main cells which involves reading the data stored in the first spare cells, reading the data stored in the second main cells and the data stored in the second spare cells, and performing the ECC processing on the data read from the second main cells using the data read from the first spare cells and the data read from the second spare cells.

12 Claims, 7 Drawing Sheets

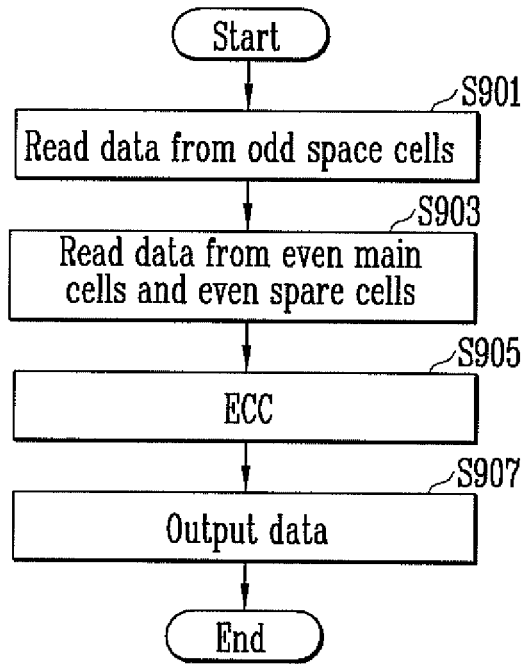
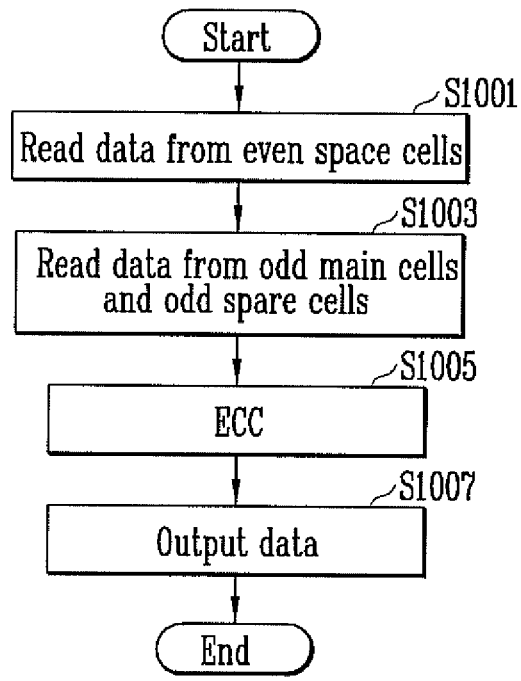

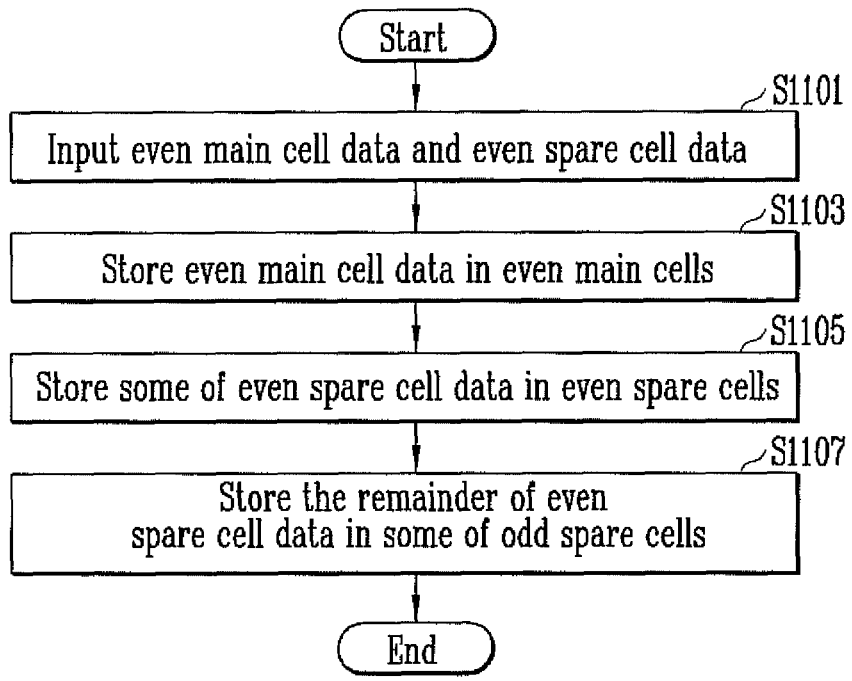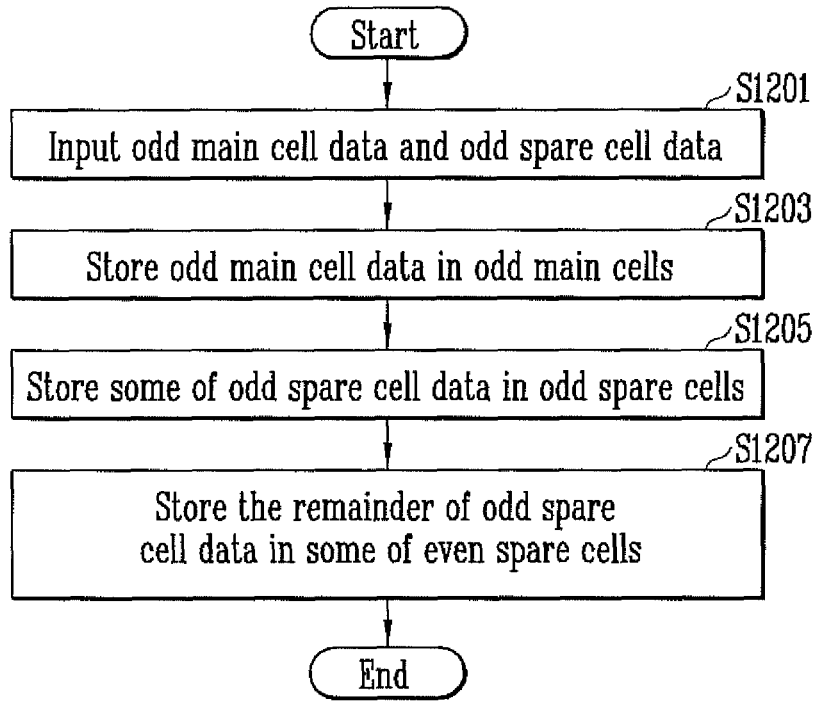

US 8,504,896 B2

METHOD OF OPERATING NONVOLATILE MEMORY DEVICE AND NONVOLATILE MEMORY DEVICE FOR IMPLEMENTING THE SAME

CROSS-REFERENCE TO RELATED APPLICATION

Priority to Korean patent application number 10-2009-0059147 filed on Jun. 30, 2009, the entire disclosure of which is incorporated by reference herein, is claimed.

BACKGROUND

Exemplary embodiments relate to a nonvolatile memory device and, more particularly, to a read method capable of correcting error using spare cells in a nonvolatile memory device.

Recently, there is an increasing demand for nonvolatile memory devices which can be electrically programmed and erased and which do not require the refresh function of rewriting data at specific intervals.

FIG. 1 is a diagram showing the construction of the memory cell array of a known nonvolatile memory device. The memory cell array includes a number of memory cell blocks, but only one memory cell block is illustrated, for the sake of simplified description.

The memory cell array includes a number of memory cell blocks. Each of the memory cell blocks includes a number of strings coupled to respective bit lines BL and in parallel coupled to a common source line CSL. Each of the strings includes memory cells MC0 to MCn configured to store data, a drain select transistor DST coupled between the bit line BL and the memory cells, and a source selection transistor SST coupled between the memory cells and the common source line CSL. The gates of the drain select transistors DST of the respective strings are coupled to a drain selection line DSL. The gates of the source selection transistors SST of the respective strings are coupled to a source selection line SSL. The gates of the memory cells MC0 to MCn are coupled to respective word lines WL0 to WLn. As shown in FIG. 1, each of the word lines is called a page. An even bit line BLe and an odd bit line BLo are alternately coupled to the cell strings.

FIG. 2 is a conceptual diagram of the memory cell array of the known nonvolatile memory device. This figure shows main cells and spare cells corresponding to one page.

Referring to FIG. 2, the number of main cells 10 coupled to the even bit line is 'n', the number of spare cells 20 is 'a', the number of main cells 30 coupled to the odd bit line is 'n', and the number of spare cells 40 is 'a'. Accordingly, a total number of the cells in one page are 2n+2α.

As described above, the number of spare cells 20 coupled to the even bit line is equal to the number of spare cells 40 coupled to the odd bit line. Such a design is based on the assumption that upon program, the error rate of cells coupled to the even bit line is equal to the error rate of cells coupled to the odd bit line. However, the error rate of the cells coupled to the even bit line is not equal to the error rate of the cells coupled to the odd bit line. Furthermore, in the case in which the cells coupled to the even bit line are first programmed and the cells coupled to the odd bit line are then programmed, the threshold voltage Vt of the cells coupled to the even bit line is influenced by interference generated when the cells coupled to the odd bit line are programmed. In such a case, the error rate of the cells coupled to the even bit line is higher than the error rate of the cells coupled to the odd bit line.

In the case in which as described above, the error rate of the cells coupled to the even bit line is higher than the error rate of the cells coupled to the odd bit line, more parity bits are required on the part of the even bit line when error correction code (hereinafter referred to as an 'ECC') processing is performed. However, if the number of spare cells 20 coupled to the even bit line is equal to the number of spare cells 40 coupled to the odd bit line as shown in FIG. 2, the parity bits stored in the spare cells 20 are insufficient when the ECC processing for the even bit line is performed, but the parity bits stored in the odd spare cells 40 remain intact when the ECC processing for the odd bit line is performed, because the same number of parity bits for the ECC processing is stored in each of the spare cells 20, 40. Accordingly, a known construction, such as that shown in FIG. 2, is a concern in that ECC processing is operated inefficiently. In the case in which when the error rate of the cells coupled to the even bit line is high, the capacity of the spare cells coupled to the even bit line is to be increased, an overall cell area is increased, resulting in increased production costs.

SUMMARY OF THE INVENTION

Exemplary embodiments relate to a nonvolatile memory device and a method of reading the same, which are capable of improving the performance of ECC processing more efficiently using spare cells.

One exemplary embodiment is directed to a method of operating a nonvolatile memory device that includes a memory cell array having first and second main cells for storing external input data, first spare cells for storing data for error correction code (ECC) processing on the data stored in the first and second main cells and second spare cells for storing data for ECC processing on the data stored in the first and second main cells which involves reading the data stored in the first spare cells, reading the data stored in the second main cells and the data stored in the second spare cells, and performing the ECC processing on the data, read from the second main cells, using the data read from the first spare cells and the data read from the second spare cells. The method may further involve outputting the data in which the ECC processing has been performed.

Reading the data stored in the first spare cells may involve reading data from first spare cells storing data for the ECC processing on the data stored in the second main cells from among the first spare cells.

Each of the data stored in the first spare cells and the data stored in the second spare cells may involve parity bit data for the ECC processing on the data stored in the second main cells.

The first main cells can be even main cells, the first spare cells can be even spare cells, the second main cells can be odd main cells and the second spare cells can be odd spare cells. Alternatively, the first main cells can be odd main cells, the first spare cells can be odd spare cells, the second main cells can be even main cells and the second spare cells can be even spare cells.

Another exemplary embodiment is directed to a method of operating a nonvolatile memory device that includes a memory cell array having first and second main cells for storing external input data, first spare cells for storing data for error correction code (ECC) processing on the data stored in the first and second main cells and second spare cells for storing data for ECC processing on the data stored in the first and second main cells which involves inputting the data of the first main cells and the data of the first spare cells, storing the data of the first main cells in the first main cells and storing some of the data of the first spare cells in the first spare cells, and storing a remainder of the data of the first spare cells in some of the second spare cells.

The data of the first spare cells may involve parity bit data for the ECC processing on the data of the first main cells.

The first main cells can be even main cells, the first spare cells can be even spare cells, the second main cells can be odd main cells and the second spare cells can be odd spare cells. Alternatively, the first main cells can be odd main cells, the first spare cells can be odd spare cells, the second main cells can be even main cells and the second spare cells can be even spare cells.

Another exemplary embodiment is directed to a nonvolatile memory device according to yet another aspect of this disclosure involving a memory cell array that includes first and second main cells for storing external input data, first spare cells for storing data for error correction code (ECC) processing on the data stored in the first and second main cells and second spare cells for storing data for ECC processing on the data stored in the first and second main cells, a page buffer unit coupled to first bit lines coupled to the first main cells and the first spare cells and second bit lines coupled to the second main cells and the second spare cells, a temporary storage unit configured to temporarily store the data stored in the first spare cells, and an ECC processing unit configured to perform ECC processing for correcting error bits in the data of the second main cells using the data of the second spare cells and the data stored in the temporary storage unit.

Each of the data stored in the first spare cells and the data stored in the second spare cells may involve parity bit data for the ECC processing.

The first main cells can be even main cells, the first spare cells can be even spare cells, the second main cells can be odd main cells and the second spare cells can be odd spare cells. Alternatively, the first main cells can be odd main cells, the first spare cells can be odd spare cells, the second main cells can be even main cells and the second spare cells can be even spare cells.

BRIEF DESCRIPTION OF THE DRAWINGS

FIGS. 9 to 12 are flowcharts illustrating a method of operating the nonvolatile memory device according to some embodiments of this disclosure.

DESCRIPTION OF EMBODIMENTS OF THE INVENTION

Hereinafter, exemplary embodiments of this disclosure will be described in detail with reference to the accompanying drawings. The figures and description are provided to enable those having ordinary skill in the art to practice the invention without undue experimentation.

Figure 3:
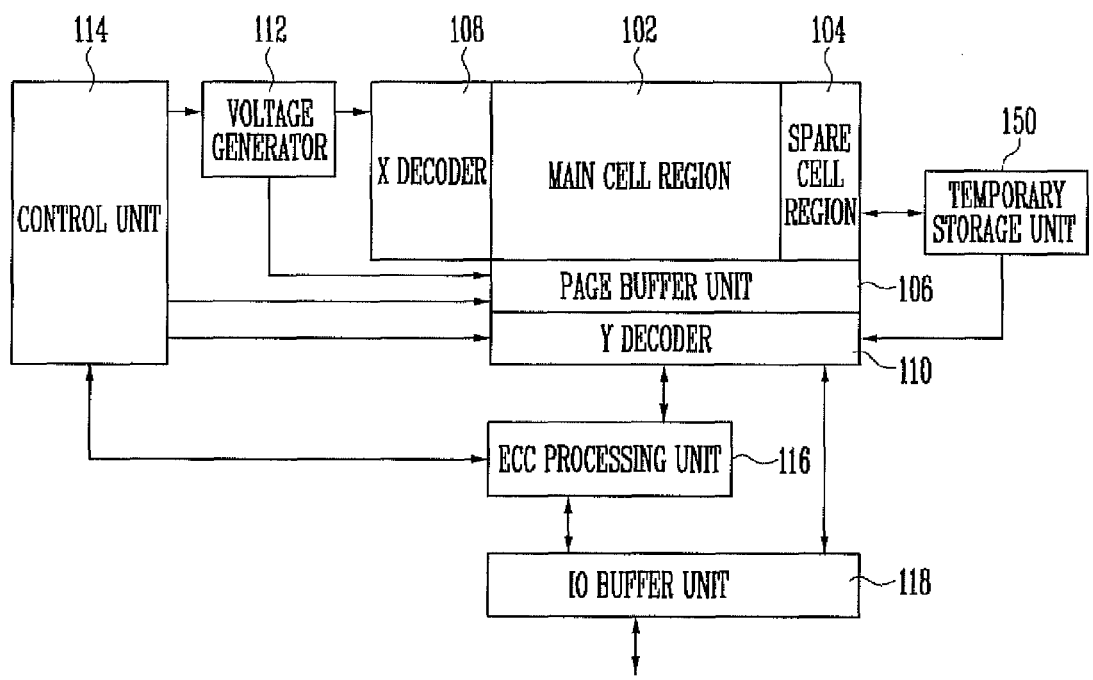
FIG. 3 is a block diagram showing the internal construction of a nonvolatile memory device according to an embodiment of this disclosure.

FIG. 3 is a block diagram showing the internal construction of a nonvolatile memory device according to an embodiment of this disclosure.

The nonvolatile memory device includes a main cell region 102, a spare cell region 104, a page buffer unit 106, an X decoder 108, a Y decoder 110, a voltage generator 112, a control unit 114, an ECC processing unit 116, an IO buffer unit 118, and a temporary storage unit 150.

The control unit 114 performs a general control operation of the nonvolatile memory device and generates a program command, an erase command, or a read command in response to a signal transmitted or received through the IO buffer unit 118.

The voltage generator 112 generates bias voltages in response to the program command, the erase command, or the read command generated by the control unit 114 and supplies them to the page buffer unit 106 and the X decoder 108.

The X decoder 108 supplies one of the memory blocks of a memory cell array with the bias voltages in response to a row address signal.

The Y decoder 110 supplies a data signal to the page buffer unit 106 in response to a column address signal.

The page buffer unit 106 includes a plurality of page buffers, each configured to store the data signal received via the IO buffer unit 118 and the Y decoder 110 and to output the data signal to bit lines shared by the memory blocks of the memory cell array. Further, each of the page buffers stores data read from the memory cell array in response to a read operation and outputs the stored data externally through the Y decoder 110 and the IO buffer unit 118. In the present exemplary embodiment, each of the page buffers of the page buffer unit 106 is coupled to an even bit line and an odd bit line of the memory cell array.

The ECC processing unit 116 performs ECC processing for correcting error in data stored in the main cells using parity bit data stored in the spare cells. In the embodiment of FIG. 3, the ECC processing unit 116 is illustrated as an independent element, but the ECC processing unit 116 may be omitted and the control unit 114 may play the role of the ECC processing unit 116 according to an embodiment.

The temporary storage unit 150 functions to temporarily store some of the parity bit data read from the spare cells. In the exemplary embodiment, the temporary storage unit 150 may be implemented using a latch.

In FIG. 3, the parity bit data stored in the spare cells and the parity bit data stored in the temporary storage unit 150 are transferred to the ECC processing unit 116 via the Y decoder 110. The ECC processing unit 116 performs the ECC processing using the parity bit data received from the spare cells and the parity bit data received from the temporary storage unit 150.

Figure 5:
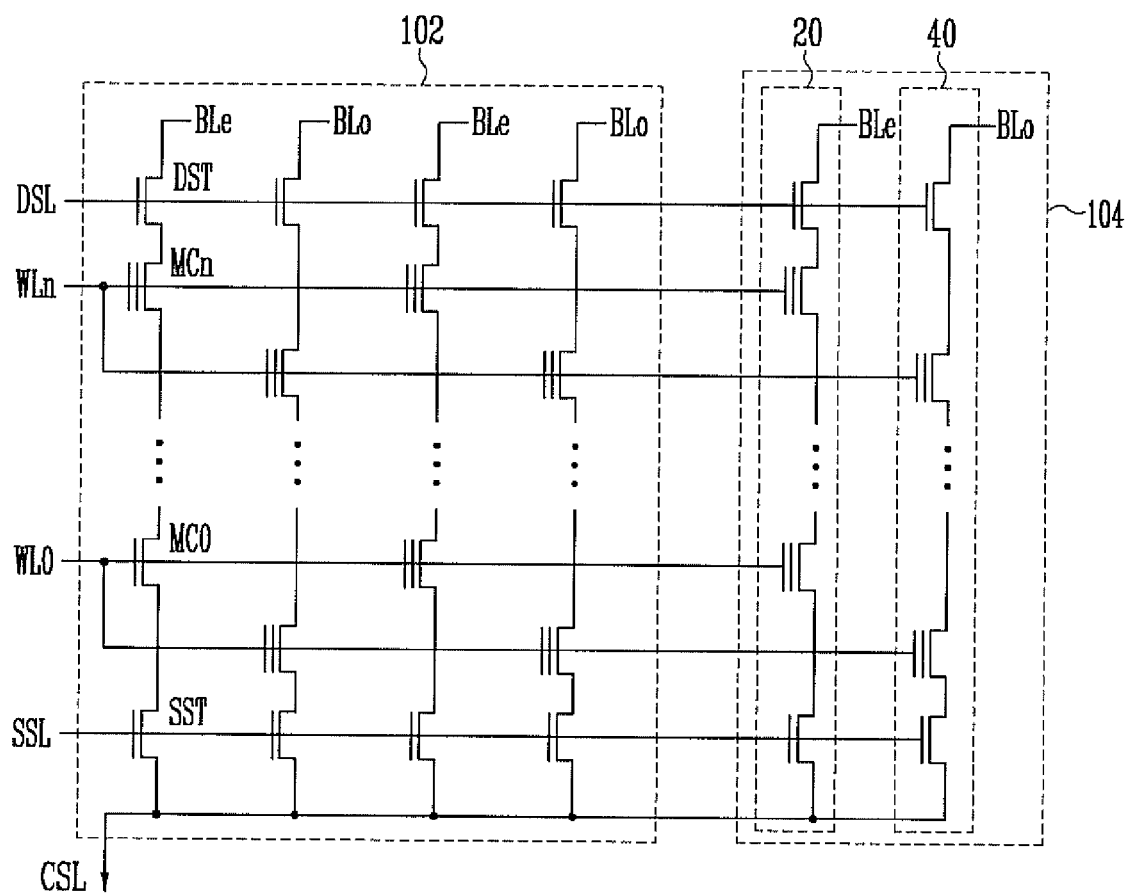
FIG. 5 is a diagram showing the construction of a memory cell array of the nonvolatile memory device according to an embodiment of this disclosure.

FIG. 5 is a diagram showing the construction of the memory cell array of the nonvolatile memory device according to an embodiment of this disclosure.

Referring to FIG. 5, the memory cell array includes the main cell region 102 and the spare cell region 104. In the embodiment of this disclosure, the control unit 114 reads data of the memory cell array from the page buffer unit 106 by performing a read operation and outputs some data of odd spare cells 40 and data read from even spare cells 20 or outputs some data of the even spare cells 20 and data read from the odd spare cells 40.

Here, the ECC processing unit 116 performs ECC processing for data, read from the main cell region 102, using parity bit data outputted from the control unit 114.

Figure 4:
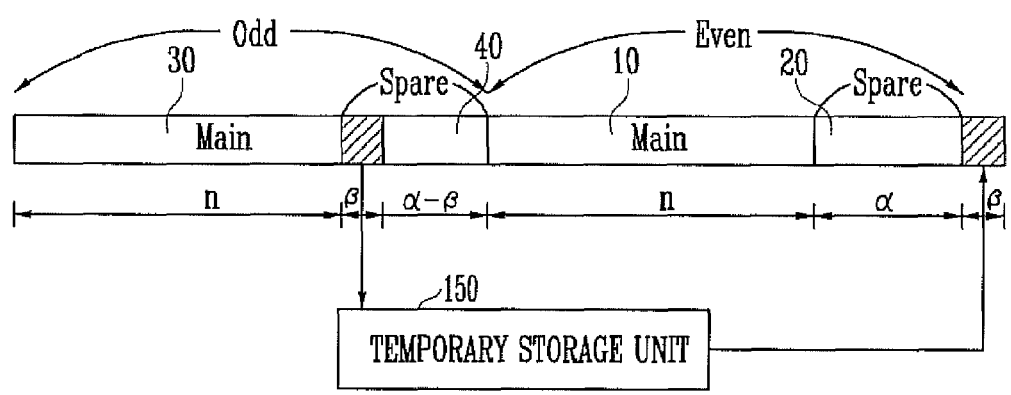
FIG. 4 is a conceptual diagram of a memory cell array of the nonvolatile memory device according to an embodiment of this disclosure.

FIG. 4 is a conceptual diagram of the memory cell array of the nonvolatile memory device according to an embodiment of this disclosure. This figure illustrates an embodiment in which a program is first performed on cells coupled to an even bit line.

Referring to FIG. 4, the control unit 114 reads data of the memory cell array from the page buffer unit 106 by performing a read operation and outputs parity bit data β read from some of the odd spare cells 40 and parity bit data β read from the even spare cells 20 at the same time. In another embodiment of this disclosure, unlike in FIG. 4, the control unit 114 can output parity bit data read from some of the even spare cells 20 and parity bit data read from the odd spare cells 40 at the same time.

Figure 1:
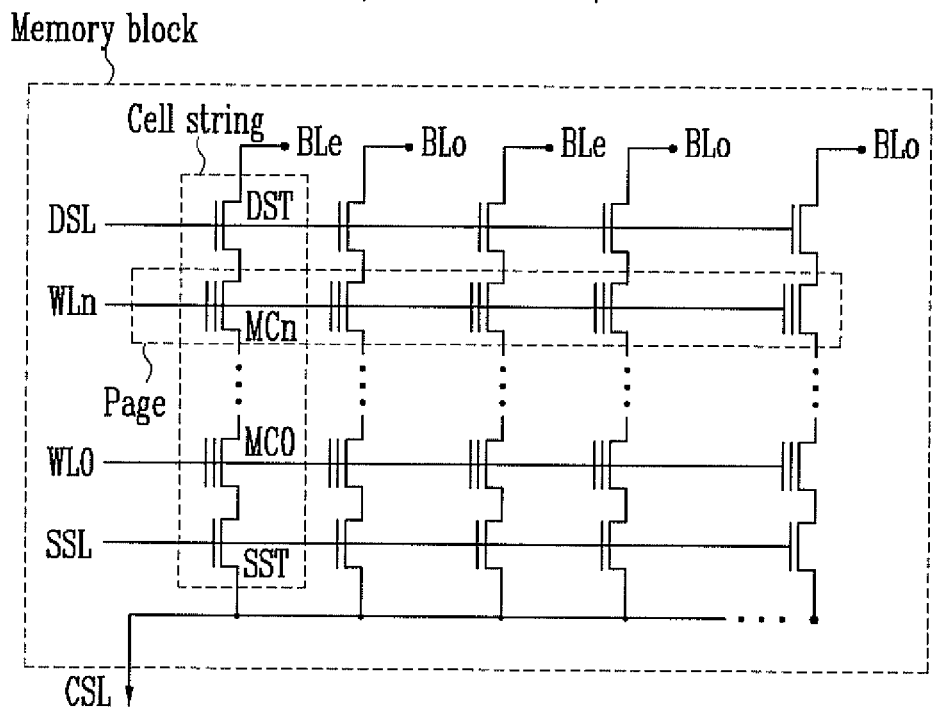
FIG. 1 is a diagram showing the construction of the cell array of a known nonvolatile memory device.
Figure 2:
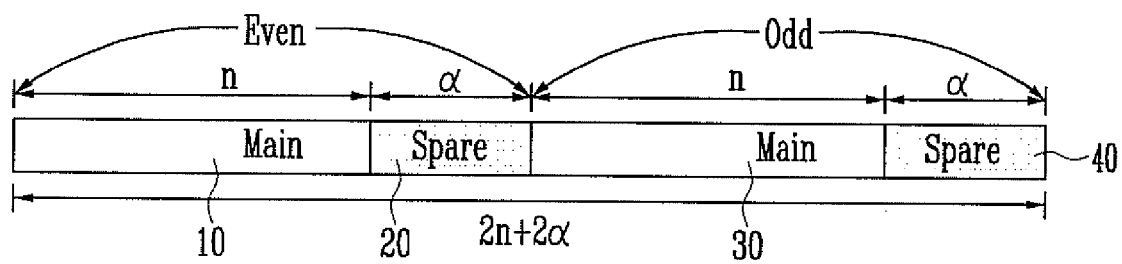
FIG. 2 is a conceptual diagram of the memory cell array of the known nonvolatile memory device.

When comparing the conceptual diagram of FIG. 4 and the known conceptual diagram of FIG. 2, it can be seen that they have the same physical page size (i.e., 2n+2a ), but each of the size of the odd spare cells 40 coupled to the odd bit line and the size of the even spare cells 20 coupled to the even bit line is reduced by the parity bit data β as compared with the conceptual diagram.

The temporary storage unit 150 can temporarily store some of the parity bit data β read from the odd spare cells 40 coupled to the odd bit line. As described above, the temporary storage unit 150 can be implemented using a latch.

The embodiment of FIG. 4 is exemplary, and alternative embodiments are possible. For example, in the case in which when a program operation is performed, cells coupled to the odd bit line are first programmed, the control unit 114 can output parity bit data read from some of even spare cells and parity bit data read from odd spare cells at the same time when a read operation is performed.

Figure 6:
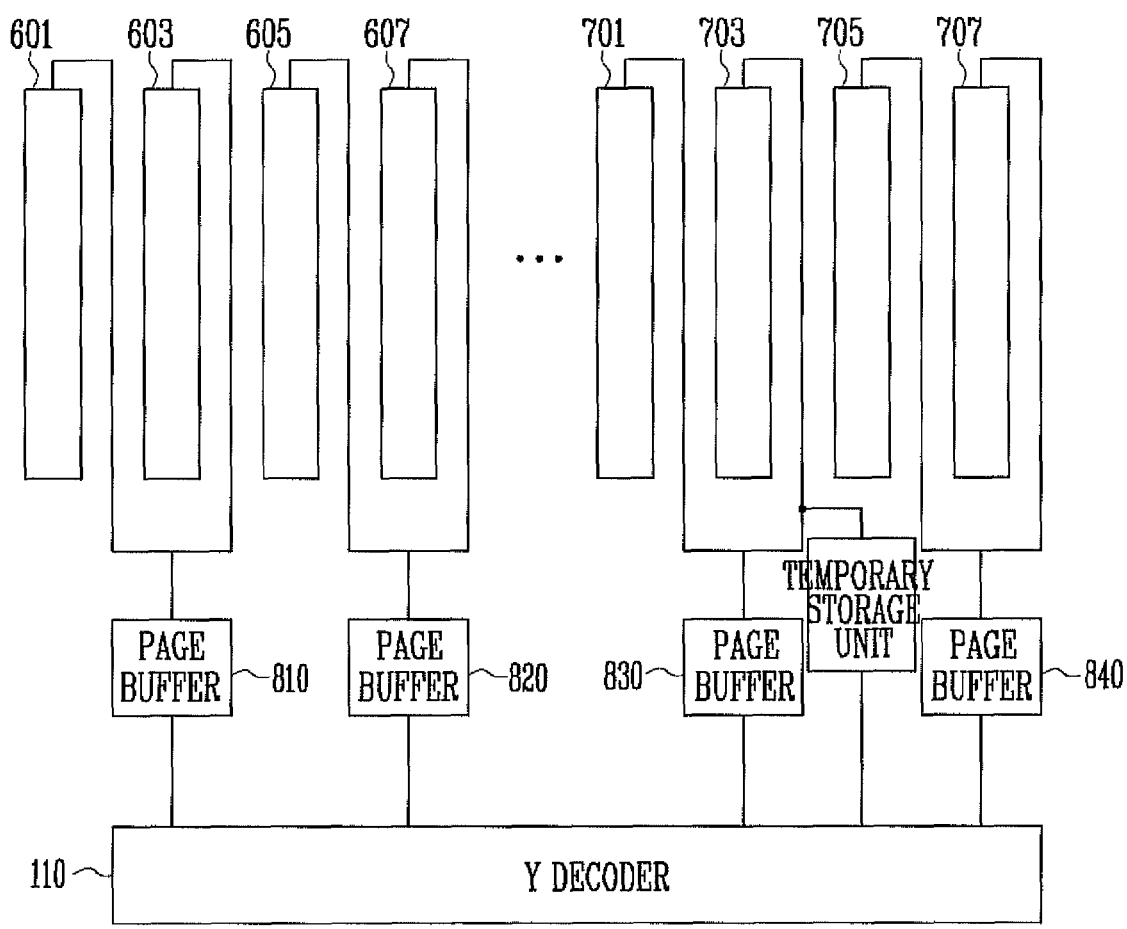
FIG. 6 is a block diagram illustrating an operation of the nonvolatile memory device according to an embodiment of this disclosure.

FIG. 6 is a block diagram illustrating the operation of the nonvolatile memory device according to an embodiment of this disclosure.

Referring to FIG. 6, the nonvolatile memory device includes main cell strings 601, 603, 605, and 607 and spare cell strings 701, 703, 705, and 707. The main cell strings include the even main cell strings 601, 605 and the odd main cell strings 603, 607. The spare cell strings include the even spare cell strings 701, 705 and the odd spare cell strings 703, 707. Page buffers 810, 820, 830, and 840 are coupled to the cell strings through even bit lines and odd bit lines.

In a read operation, data are read from the even main cell strings 601, 605 and the even spare cell strings 701, 705. Next, data are read from the odd spare cell string 703 storing the spare data of even main cells, from among the odd spare cell strings 703, 707 and then stored in the temporary storage unit 150. The data stored in the temporary storage unit 150 are outputted through the Y decoder 110. An exemplary structure of the data outputted through the Y decoder 110 is shown in FIG. 8.

Figure 8:
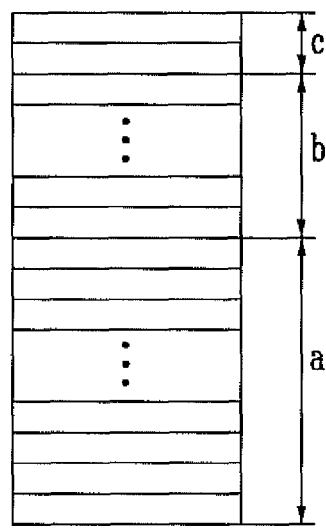
FIG. 8 is a diagram showing a data structure according to an embodiment of this disclosure.

Referring to FIG. 8, even main cell data 'a', even spare cell data 'b', and odd spare cell data 'c' are outputted through the Y decoder 110. The ECC processing unit 116 performs ECC processing for the even main cell data 'a' using the even spare cell data 'b' and the odd spare cell data 'c'.

Figure 7:
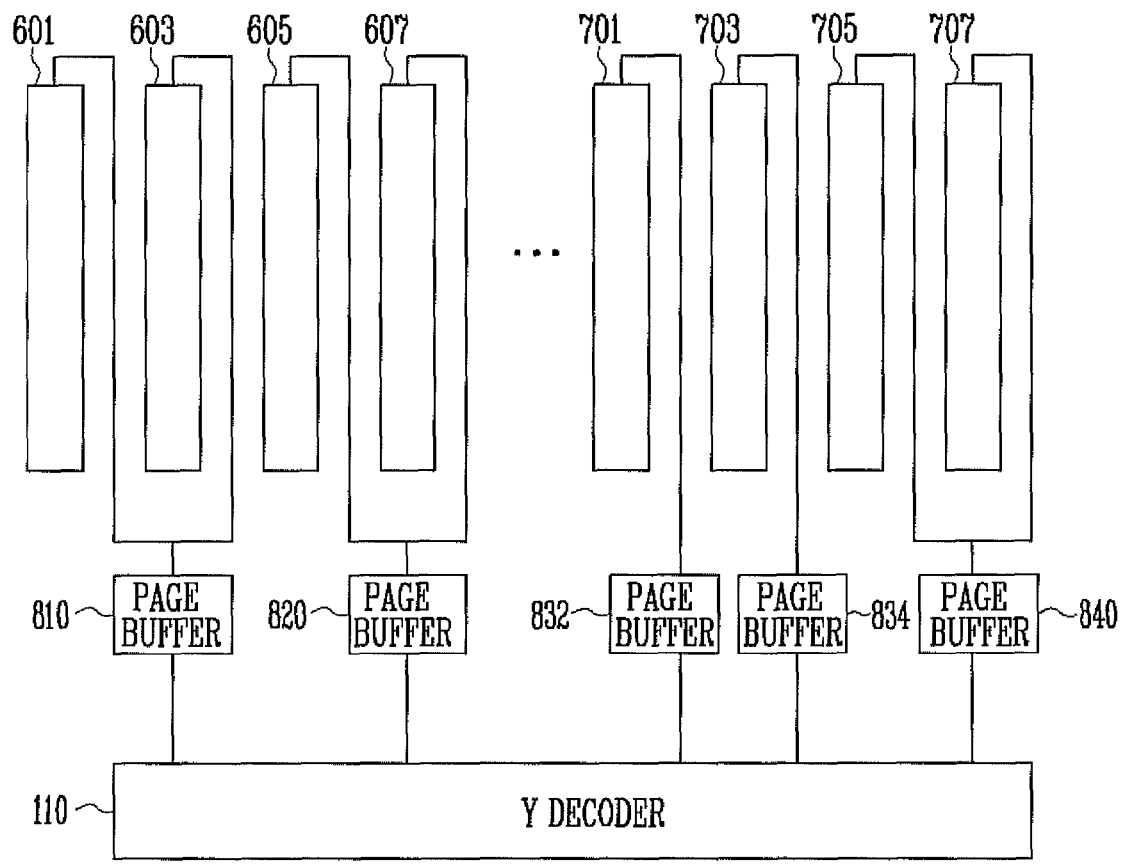
FIG. 7 is a block diagram illustrating an operation of the nonvolatile memory device according to another embodiment of this disclosure.

FIG. 7 is a block diagram illustrating an operation of the nonvolatile memory device according to another embodiment of this disclosure.

The embodiment of FIG. 7 differs from the embodiment of FIG. 6 in that different page buffers 832, 834 are coupled to an even spare cell 701 and an odd spare cell 703 and the temporary storage unit 150 is omitted. In FIG. 7, data read from the odd spare cell 703 are outputted through the Y decoder 110 via the page buffer 834.

Referring to FIG. 7, the nonvolatile memory device includes page buffers 810, 820 coupled to main memory cells, the page buffer 832 coupled to even spare cells, the page buffer 834 coupled to odd spare cells, and a page buffer 840 coupled to both the even spare cells and the odd spare cells. As described above, in FIG. 7, since the page buffer 834 is separately coupled to the odd spare cells, the present disclosure can be implemented without using the temporary storage unit 150.

FIG. 9 is a flowchart illustrating a method of operating the nonvolatile memory device according to an embodiment of this disclosure. This figure shows a read operation of the operations of the nonvolatile memory device.

Data stored in the odd spare cells 40 are read at step S901. Here, the data are read from odd spare cells storing data for ECC processing on the even main cells 10, from among the odd spare cells 40.

Data stored in the even main cells 10 and the even spare cells 20 are read at step S903.

The ECC processing is performed on the data, read from the even main cells 10, using the data of the even spare cells 20 and the data of the odd spare cells 40 at step S905. In the exemplary embodiment of this disclosure, the data of the odd spare cells 40 and the even spare cells 20 can include parity bit data for the ECC processing on the data of the even main cells 10.

The data on which the ECC processing has been performed are outputted at step S907.

FIG. 10 is a flowchart illustrating a method of operating the nonvolatile memory device according to another embodiment of this disclosure. This figure shows a read operation of the operations of the nonvolatile memory device.

Data stored in the even spare cells 20 are read at step S1001. Here, the data are read from even spare cells storing data for ECC processing on the odd main cells 30, from among the even spare cells 20.

Data stored in the odd main cells 30 and the odd spare cells 40 are read at step S1003.

The ECC processing is performed on the data, read from the odd main cells 30, using the data of the odd spare cells 40 and the data of the even spare cells 20 at step S1005. In the exemplary embodiment, the data of the even spare cells 20 and the odd spare cells 40 can include parity bit data for the ECC processing on the data of the even main cells 10. The data on which the ECC processing has been performed are outputted at step S1007.

FIG. 11 is a flowchart illustrating a method of operating the nonvolatile memory device according to yet another embodiment of this disclosure. This figure shows a program operation of the nonvolatile memory device.

Even main cell data and even spare cell data are inputted at step S1101. Here, the even spare cell data can include parity bit data for ECC processing on the even main cell data.

The even main cell data are stored in the even main cells 10 at step S1103, and some of the even spare cell data are stored in the even spare cells 20 at step S1105.

The remainder of the even spare cell data is stored in the odd spare cells 40 at step S1107.

FIG. 12 is a flowchart illustrating a method of operating the nonvolatile memory device according to further yet another embodiment of this disclosure. This figure shows a program operation of the operations of the nonvolatile memory device.

Odd main cell data and odd spare cell data are inputted at step S1201. Here, the odd spare cell data can include parity bit data for ECC processing on the odd main cell data.

The odd main cell data are stored in the odd main cells 30 at step S1203, and some of the odd spare cell data are stored in the odd spare cells 40 at step S1205.

The remainder of the odd spare cell data is stored in the even spare cells 20 at step S1207.

According to the exemplary embodiments of this disclosure, in a nonvolatile memory device, the performance of ECC processing can be improved efficiently using spare cells without increasing the number of spare cells. Accordingly, there is an advantage in that additional costs can be saved by improving the performance of ECC processing without increasing a cell area.

What is claimed is:

1. A method of operating a nonvolatile memory device including a memory cell array having first and second main cells for storing first and second data, first spare cells for storing third data for error correction code processing on the first data stored in the first main cells and second spare cells for storing fourth data for error correction code processing on the second data stored in the second main cells, the method comprising:
    inputting the first data to be stored in the first main cells and the third data to be stored in the first spare cells;
    storing the first data in the first main cells and storing a part of the third data in the first spare cells; and
    storing a remainder of the third data in a part of the second spare cells.

2. The method of claim 1, wherein the third data stored in the first spare cells comprises a part of parity bit data for the error correction code processing on the first data stored in the first main cells and the fourth data stored in the second spare cells comprises a remainder of the parity bit data for the error correction code processing on the data stored in the first main cells.

3. The method of claim 1, wherein:
    the first main cells are even main cells,
    the first spare cells are even spare cells,
    the second main cells are odd main cells, and
    the second spare cells are odd spare cells.

4. The method of claim 1, wherein:
    the first main cells are odd main cells,
    the first spare cells are odd spare cells,
    the second main cells are even main cells, and
    the second spare cells are even spare cells.

5. The method of claim 1, further comprising:
    reading the remainder the third data stored in the part of the second spare cells;
    reading the first data stored in the first main cells and reading the part of the third data stored in the first spare cells; and
    performing the error correction code processing on the first data, read from the first main cells, using the third data read from the first spare cell and the part of the second spare cells.

6. The method of claim 5, further comprising outputting the first data in which the error correction code processing has been performed.

7. The method of claim 5, wherein:
    the first main cells are even main cells,
    the first spare cells are even spare cells,
    the second main cells are odd main cells, and
    the second spare cells are odd spare cells.

8. The method of claim 5, wherein:
    the first main cells are odd main cells,
    the first spare cells are odd spare cells,
    the second main cells are even main cells, and
    the second spare cells are even spare cells.

9. A nonvolatile memory device, comprising:
    a memory cell array configured to comprise first and second main cells for storing first and second data, first spare cells for storing a part of third data for error correction code processing on the first data stored in the first main cells and second spare cells for storing a remainder of the third data and fourth data for error correction code processing on the second data stored in the second main cells;
    a page buffer unit coupled to first bit lines coupled to the first main cells and the first spare cells and second bit lines coupled to the second main cells and the second spare cells;
    a temporary storage unit configured to temporarily store the remainder of the third data stored in the second spare cells; and
    an error correction code processing unit configured to perform error correction code processing for correcting error bits in the first data of the first main cells using the part of the third data of the first spare cells and the remainder of the third data stored in the temporary storage unit.

10. The nonvolatile memory device of claim 9, wherein the part of the third data stored in the first spare cells comprises a part of parity bit data for the error correction code processing on the first data and the remainder of the third data stored in the second spare cells comprises a remainder of the parity bit data for the error correction code processing on the first data.

11. The nonvolatile memory device of claim 9, wherein:
    the first main cells are even main cells,
    the first spare cells are even spare cells,
    the second main cells are odd main cells, and
    the second spare cells are odd spare cells.

12. The nonvolatile memory device of claim 9, wherein:
    the first main cells are odd main cells,
    the first spare cells are odd spare cells,
    the second main cells are even main cells, and
    the second spare cells are even spare cells.

* * * * *